(12) United States Patent
Zhang

(10) Patent No.: US 12,527,135 B2
(45) Date of Patent: Jan. 13, 2026

(54) LIGHT-EMITTING SUBSTRATE AND MANUFACTURING METHOD THEREOF

(71) Applicants: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

(72) Inventor: Liang Zhang, Guangdong (CN)

(73) Assignees: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 618 days.

(21) Appl. No.: 17/822,792

(22) Filed: Aug. 28, 2022

(65) Prior Publication Data

US 2024/0047632 A1    Feb. 8, 2024

(30) Foreign Application Priority Data

Aug. 3, 2022    (CN) .......................... 202210927803.6

(51) Int. Cl.
*H10H 20/857*    (2025.01)
*H01L 25/075*    (2006.01)
*H10H 20/01*    (2025.01)

(52) U.S. Cl.
CPC ....... *H10H 20/857* (2025.01); *H01L 25/0753* (2013.01); *H10H 20/0364* (2025.01)

(58) Field of Classification Search
CPC .......... H01L 25/0753; H10H 20/0364; H10H 20/01; H10H 20/831; H10H 20/81; H10H 20/83; H10H 29/142; H10H 20/857
See application file for complete search history.

(56) References Cited

U.S. PATENT DOCUMENTS

| | | | |
|---|---|---|---|
| 6,573,610 B1 * | 6/2003 | Tsai ........................ | H01L 24/81 257/E21.511 |
| 7,652,374 B2 * | 1/2010 | Kok ..................... | H05K 3/3436 257/772 |

(Continued)

FOREIGN PATENT DOCUMENTS

| | | |
|---|---|---|
| CN | 107833525 A | 3/2018 |
| CN | 110676360 A | 1/2020 |

(Continued)

OTHER PUBLICATIONS

Chinese Office Action issued in corresponding Chinese Patent Application No. 202210927803.6 dated Apr. 17, 2025. pp. 1-14.

(Continued)

*Primary Examiner* — Victor A Mandala
(74) *Attorney, Agent, or Firm* — PV IP PC; Christopher S. Ruprecht; Wei Te Chung

(57) ABSTRACT

A light-emitting substrate and a manufacturing method thereof are provided. The light-emitting substrate includes a first substrate and a plurality of light-emitting units. The first substrate includes a plurality sets of electrode opening-holes. Each light-emitting unit includes a first side and a second side disposed opposite to each other. Each light-emitting unit includes an electrode unit disposed on the first side, and the electrode unit is positioned in the electrode opening-holes. A wettability of the first side is greater than a wettability of the second side.

11 Claims, 8 Drawing Sheets

(56) References Cited

U.S. PATENT DOCUMENTS

| | | | |
|---|---|---|---|
| 10,643,981 B2* | 5/2020 | Schuele | H01L 25/0753 |
| 2018/0053750 A1* | 2/2018 | Kim | H01L 25/50 |
| 2019/0131266 A1* | 5/2019 | Aoki | G02B 6/13 |
| 2022/0045252 A1* | 2/2022 | Fan | B23K 3/0669 |
| 2022/0112423 A1* | 4/2022 | Patel-Framroze | C12N 9/50 |
| 2022/0131044 A1* | 4/2022 | Li | H01L 25/0753 |
| 2023/0036183 A1* | 2/2023 | Xu | H01L 25/167 |
| 2023/0097502 A1* | 3/2023 | Liang | H01L 24/05 257/89 |
| 2023/0112423 A1* | 4/2023 | Yang | H01L 24/06 257/91 |
| 2024/0177634 A1* | 5/2024 | Yue | H01L 25/0753 |
| 2025/0081696 A1* | 3/2025 | An | H01L 25/167 |

FOREIGN PATENT DOCUMENTS

| | | |
|---|---|---|
| CN | 112993136 A | 6/2021 |
| KR | 20180115134 A | 10/2018 |

OTHER PUBLICATIONS

Chinese Office Action issued in corresponding Chinese Patent Application No. 202210927803.6 dated Oct. 24, 2024, pp. 1-12.

* cited by examiner

LIGHT-EMITTING SUBSTRATE AND MANUFACTURING METHOD THEREOF

FIELD OF INVENTION

The present disclosure relates to the field of display technologies, and more particularly, to a light-emitting substrate and a manufacturing method thereof.

BACKGROUND OF INVENTION

In recent years, mini-light-emitting diode (mini-LED) display panels and micro-light-emitting diode (micro-LED) display panels are more and more popular among consumers due to their good display effects. In production processes of mini-LEDs and micro-LEDs, LED chips need to be transferred. When a resolution is high, a number of LED chips that need to be transferred is larger, and a difficulty of transfer is greater.

Therefore, it is necessary to provide a light-emitting substrate and a manufacturing method thereof to solve the above technical problems.

SUMMARY OF INVENTION

The present disclosure provides a light-emitting substrate and a manufacturing method thereof, which can solve the technical problem of great difficulty of transferring LED chips in current technology.

The present disclosure provides a light-emitting substrate, which includes:
  a first substrate including a plurality sets of electrode opening-holes; and
  a plurality of light-emitting units each including a first side and a second side disposed opposite to each other, wherein, each light-emitting unit includes an electrode unit disposed on the first side, and the electrode unit is positioned in the electrode opening-holes;
  wherein, a wettability of the first side is greater than a wettability of the second side.

Preferably, each of the light-emitting units further includes a first functional layer disposed on the first side, and the first side includes a surface of the first functional layer away from the second side; and an equilibrium contact angle of a first liquid on the surface of the first functional layer is less than 90°.

Preferably, each of the light-emitting units further includes a second functional layer disposed on the second side, and the second side includes a surface of the second functional layer away from the first side; and an equilibrium contact angle of the first liquid on the surface of the second functional layer is greater than 90°.

Preferably, the first liquid includes one of water, anhydrous ethanol, or benzene.

Preferably, each of the light-emitting units further includes a light-emitting chip electrically connected to the electrode unit; the first functional layer covers the light-emitting chip and the electrode unit; and the first functional layer includes a conductive material.

Preferably, the first substrate includes a driving circuit layer and a planarization layer disposed on the driving circuit layer, and the planarization layer includes the electrode opening-holes; and the electrode unit is electrically connected to the driving circuit layer by the electrode opening-holes.

Preferably, one set of the electrode opening-holes includes a positive electrode opening-hole and a negative electrode opening-hole; one electrode unit includes a positive electrode unit and a negative electrode unit; and a size of the positive electrode opening-hole is different from a size of the negative electrode opening-hole, the positive electrode unit corresponds to the positive electrode opening-hole, and the negative electrode opening-hole corresponds to the negative electrode unit.

Preferably, the light-emitting substrate further includes a third functional layer disposed in at least one of the electrode opening-holes, wherein, an equilibrium contact angle of a first liquid on a surface of the third functional layer is less than 90°.

The present disclosure further provides a manufacturing method of a light-emitting substrate, which includes following steps:
  providing a first substrate including a plurality sets of electrode opening-holes;
  providing a plurality of light-emitting units, wherein, each of the light-emitting units includes a first side and a second side disposed opposite to each other, a wettability of the first side is greater than a wettability of the second side, and each light-emitting unit includes an electrode unit disposed on the first side;
  mixing a first liquid with the light-emitting units to form a suspension; and
  coating the suspension on the first substrate, the electrode unit of the light-emitting units in the suspension correspondingly falling in the electrode opening-holes, heating the first substrate to remove the first liquid, and forming the light-emitting substrate.

Preferably, the step of providing the plurality of light-emitting units, wherein, each of the light-emitting units comprises the first side and the second side disposed opposite to each other, the wettability of the first side is greater than the wettability of the second side, and each light-emitting unit comprises the electrode unit disposed on the first side, includes following steps: providing the plurality of light-emitting units, wherein, each light-emitting unit includes a light-emitting chip and the electrode unit; and forming a first functional layer on a surface of the electrode unit to form the first side of the light-emitting units, wherein, an equilibrium contact angle of the first liquid on a surface of the first functional layer is less than 90°.

Preferably, the step of providing the plurality of light-emitting units, wherein, each of the light-emitting units comprises the first side and the second side disposed opposite to each other, the wettability of the first side is greater than the wettability of the second side, and each light-emitting unit comprises the electrode unit disposed on the first side, includes following steps: providing the plurality of light-emitting units, wherein, each light-emitting unit includes the light-emitting chip and the electrode unit; and forming a second functional layer on an opposite side surface of the electrode unit to form the second side of the light-emitting units, wherein an equilibrium contact angle of the first liquid on a surface of the second functional layer is greater than 90°.

Preferably, the step of providing the first substrate including the plurality sets of electrode opening-holes includes a following step: providing the first substrate including a plurality sets of first opening-holes, a plurality sets of second opening-holes, and a plurality sets of third opening-holes; the step of providing the plurality of light-emitting units includes a following step: providing the plurality of light-emitting units including a plurality of first color units, a plurality of second color units, and a plurality of third color units, wherein, light-emitting colors of the first color units, the second color units, and the third color units are different from each other; the step of mixing the first liquid with the light-emitting units to form the suspension includes following steps: mixing the first liquid with the first color units to form a first suspension; mixing the first liquid with the second color units to form a second suspension; and mixing the first liquid with the third color units to form a third suspension; the step of coating the suspension on the first substrate and the electrode unit of the light-emitting units in the suspension correspondingly falling in the electrode opening-holes, includes following steps: providing a first mask including a plurality of first openings, wherein, the first openings expose the first opening-holes; aligning the first mask with the first substrate; coating the first suspension on the first substrate, and the electrode unit of the first color units in the first suspension correspondingly falling in the first opening-holes; heating the first substrate to remove the first liquid; removing the first color units located outside the first opening-holes; providing a second mask including a plurality of second openings, wherein, the second openings expose the second opening-holes; aligning the second mask with the first substrate; coating the second suspension on the first substrate, and the electrode unit of the second color units in the second suspension correspondingly falling in the second opening-holes; heating the first substrate to remove the first liquid; removing the second color units located outside the second opening-holes; providing a third mask including a plurality of third openings, wherein, the third openings expose the third opening-holes; aligning the third mask with the first substrate; coating the third suspension on the first substrate, and the electrode unit of the third color units in the third suspension correspondingly falling in the third opening-holes; heating the first substrate to remove the first liquid; removing the third color units located outside the third opening-holes, and forming the light-emitting substrate.

Beneficial effect of the present disclosure: in the present disclosure, surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with the first liquid and coated on the first substrate. Taking advantage of the strong wettability of the first side, the electrode unit moves toward the first substrate. When the first liquid is evaporated, an evaporation rate of the first liquid in the electrode opening-holes is slow, thereby gradually leading the light-emitting units into the electrode opening-holes and realizing the alignment and fixation between the light-emitting units and the first substrate. Therefore, a transferring method of the light-emitting units is optimized, and a transferring speed of the light-emitting units is accelerated, and a production efficiency is improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
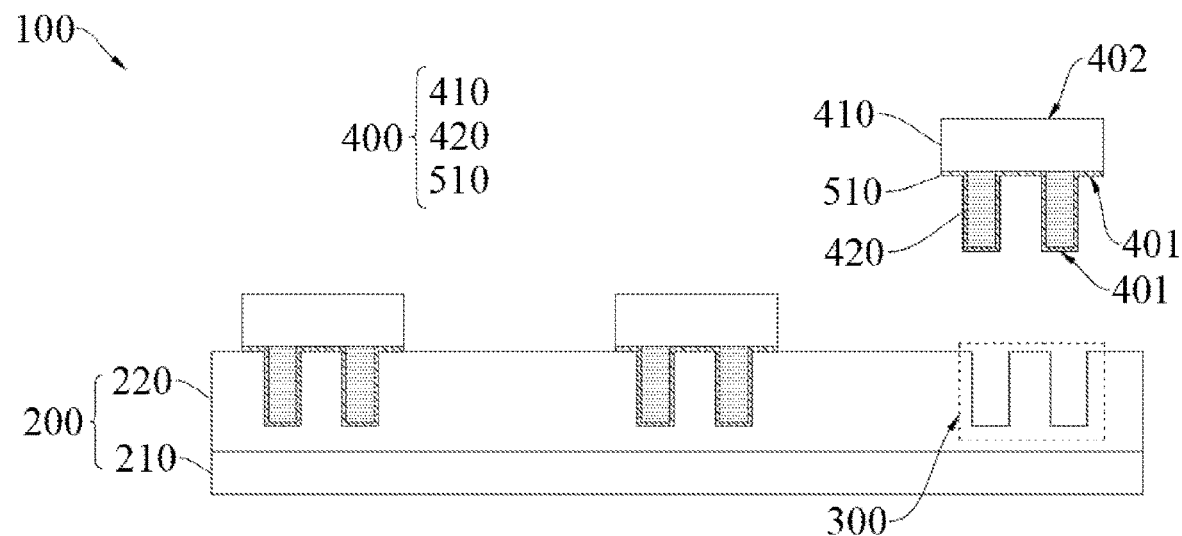
FIG. 1 is a schematic structural diagram of a first structure of a light-emitting substrate according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

In recent years, mini-light-emitting diode (mini-LED) display panels and micro-light-emitting diode (micro-LED) display panels are more and more popular among consumers due to their good display effects. In production processes of mini-LEDs and micro-LEDs, LED chips need to be transferred. When a resolution is high, a number of LED chips that need to be transferred is larger, and a difficulty of transfer is greater.

Referring to FIGS. 1 to 6, an embodiment of the present disclosure provides a light-emitting substrate 100, which includes:

a first substrate 200 including a plurality sets of electrode opening-holes 300; and a plurality of light-emitting units 400 each including a first side 401 and a second side 402 disposed opposite to each other, wherein, each light-emitting unit 400 includes an electrode unit 420 disposed on a same side as the first side 401, and the electrode unit 420 is positioned in the electrode opening-holes 300.

Wherein, a wettability of the first side 401 is greater than a wettability of the second side 402.

In the present disclosure, surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with a first liquid and coated on the first substrate. Taking advantage of the strong wettability of the first side, the electrode unit moves toward the first substrate. When the first liquid is evaporated, an evaporation rate of the first liquid in the electrode opening-holes is slow, thereby gradually leading the light-emitting units into the electrode opening-holes and realizing the alignment and fixation between the light-emitting units and the first substrate. Therefore, a transferring method of the light-emitting units is optimized, and a transferring speed of the light-emitting units is accelerated, and a production efficiency is improved.

Specific embodiments are used to describe technical solutions of the present disclosure.

In some embodiments, an extent of wettability can be represented by an equilibrium contact angle. The equilibrium contact angle refers to at a three-phase junction of solid, liquid, and gas, an included angle between a solid-liquid interface and a gas-liquid interface through an interior of liquid. If an equilibrium contact angle of a same liquid on a material is larger, a wettability of the corresponding material is weaker. A contact angle measuring instrument may be used to measure the equilibrium contact angle. For example, a wettability of a material having a contact angle of 100° is less than a wettability of a material having a contact angle of 80°. For example, when an equilibrium contact angle of the first liquid on the first side 401 is 80° and an equilibrium contact angle of the first liquid on the second side 402 is 100°, it can prove that the wettability of the first side 401 is greater than the wettability of the second side 402. Wherein, the first liquid may be a liquid for a conventional contact angle test instrument, or the first liquid for manufacturing the light-emitting substrate of the present disclosure: one of water, anhydrous ethanol, or benzene. This is only an example, and there is no specific limitation.

In some embodiments, referring to FIG. 1, each of the light-emitting units 400 further includes a first functional layer 510 disposed on a same side as the first side 401, and the first side 401 includes a surface of the first functional layer 510 away from the second side 402. Wherein, an equilibrium contact angle of the first liquid on the surface of the first functional layer 510 is less than 90°.

Figure 8A:
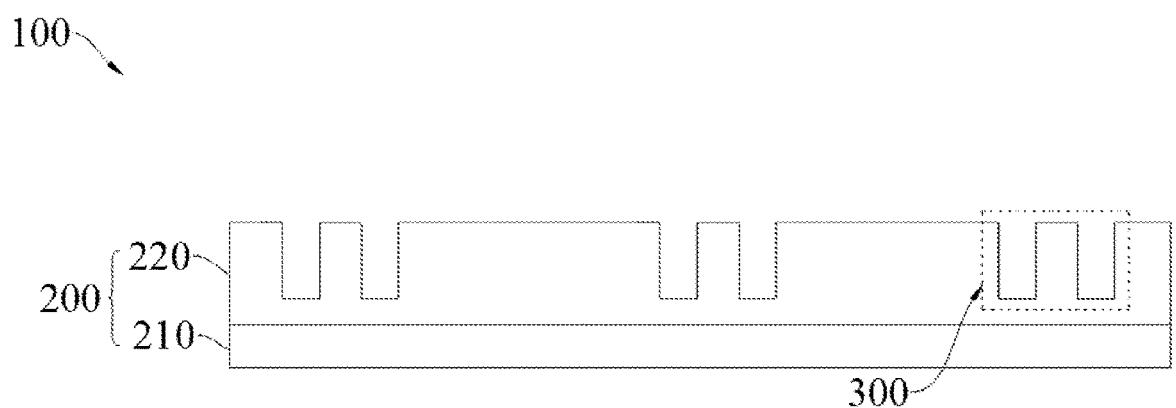
FIGS. 8A to 8C are first schematic process diagrams of the manufacturing method of the light-emitting substrate according to an embodiment of the present disclosure.
Figure 8B:
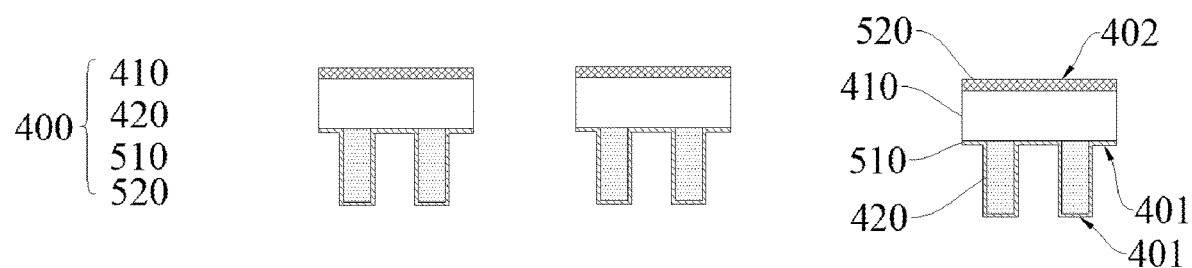
Figure 8C:
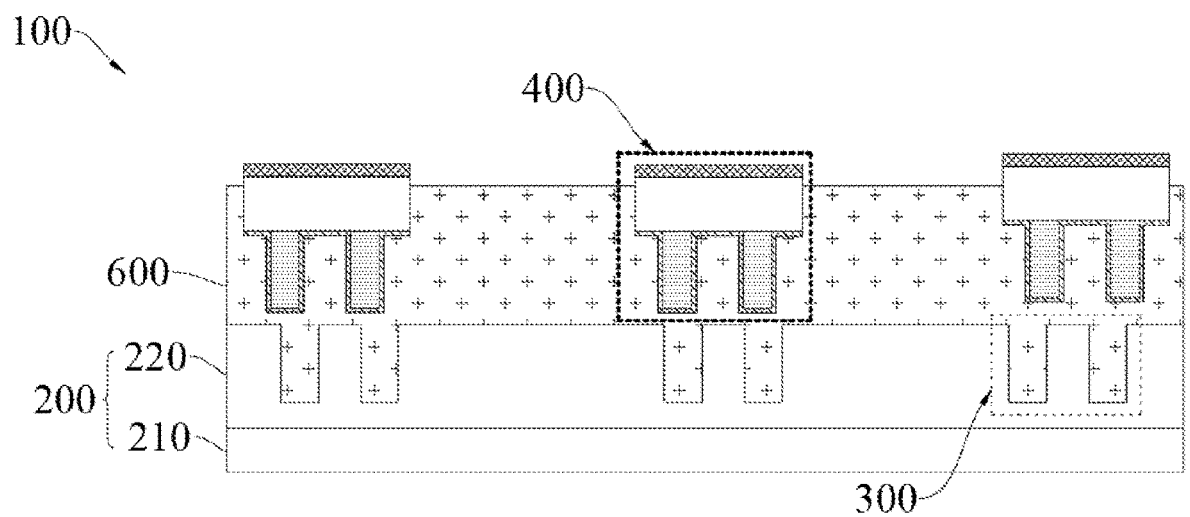

Referring to FIGS. 1 and 8C, a surface of the light-emitting units 400 on a same side as the electrode unit 420 is the first side 401, a surface of the light-emitting units 400 on an opposite side of the electrode unit 420 is the second side 402, and a side surface of the first functional layer 510 away from the second side 402 together constitutes the first side 401. The equilibrium contact angle of the first liquid on the surface of the first functional layer 510 is less than 90°, so that the first side 401 can have a stronger wettability, and in the process of manufacturing display substrates, it is convenient to transfer the light-emitting units 400. With evaporation of the first liquid 600, it is favorable for the light-emitting units 400 to flow to corresponding electrode opening-holes 300, thereby facilitating the alignment between the electrode unit 420 and corresponding electrode opening-holes 300.

Referring to FIGS. 1 and 8C, the first side 401 having the strong wettability moves toward the first liquid 600 and toward the first substrate 200. An evaporation rate of the first liquid 600 in the electrode opening-holes 300 is slow, thereby gradually leading the light-emitting units 400 into the electrode opening-holes 300 and realizing the alignment and fixation between the light-emitting units 400 and the first substrate 200. Therefore, a transferring method of light-emitting chips 410 is optimized, and a transferring speed of the light-emitting chips 410 is accelerated, and a production efficiency is improved.

Figure 2:
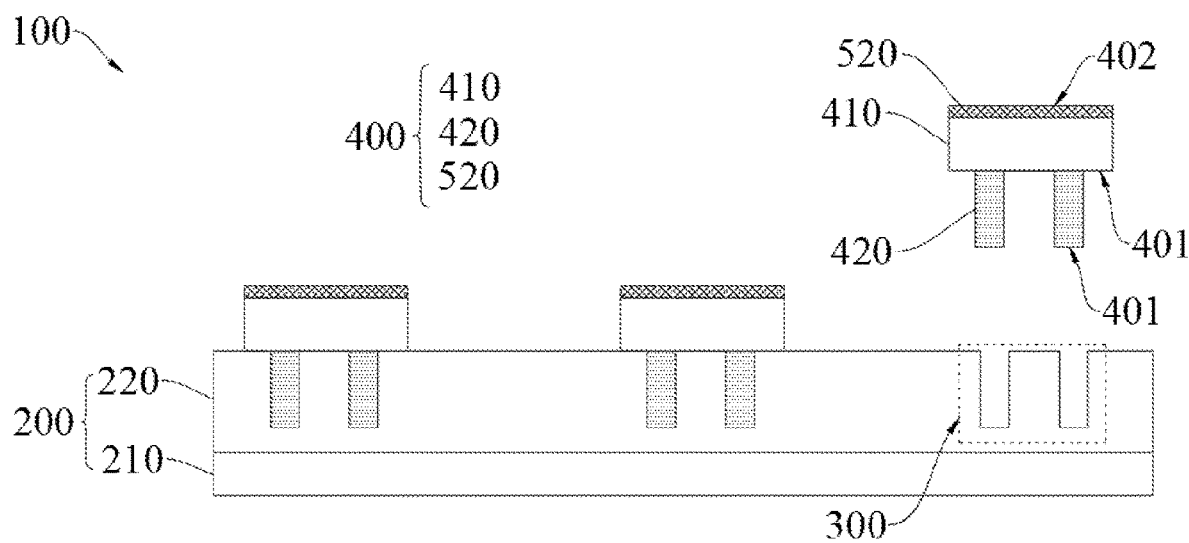
FIG. 2 is a schematic structural diagram of a second structure of the light-emitting substrate according to an embodiment of the present disclosure.
Figure 3:
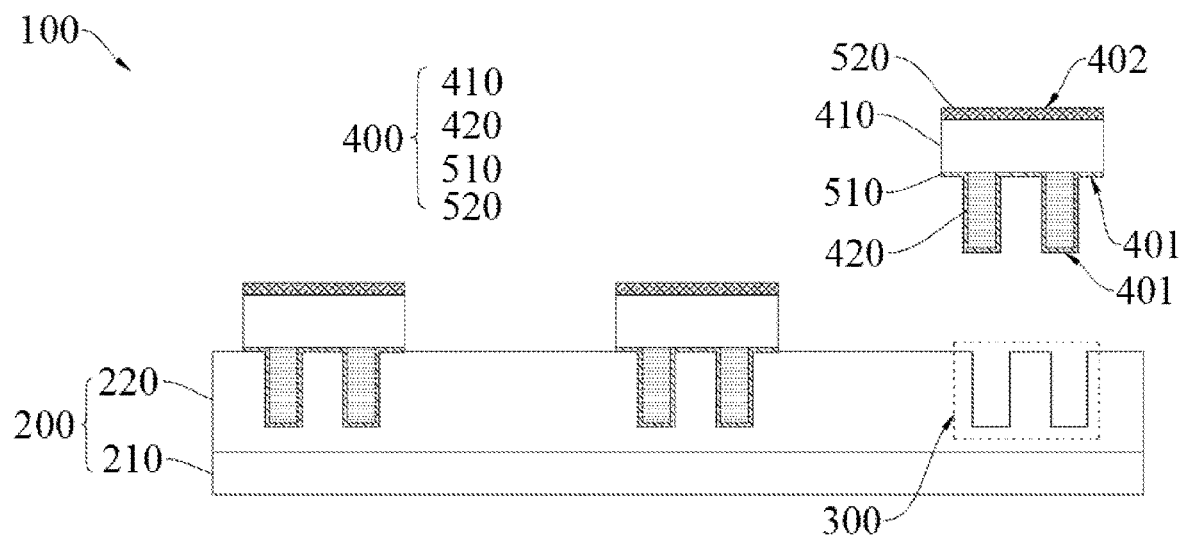
FIG. 3 is a schematic structural diagram of a third structure of the light-emitting substrate according to an embodiment of the present disclosure.
Figure 4:
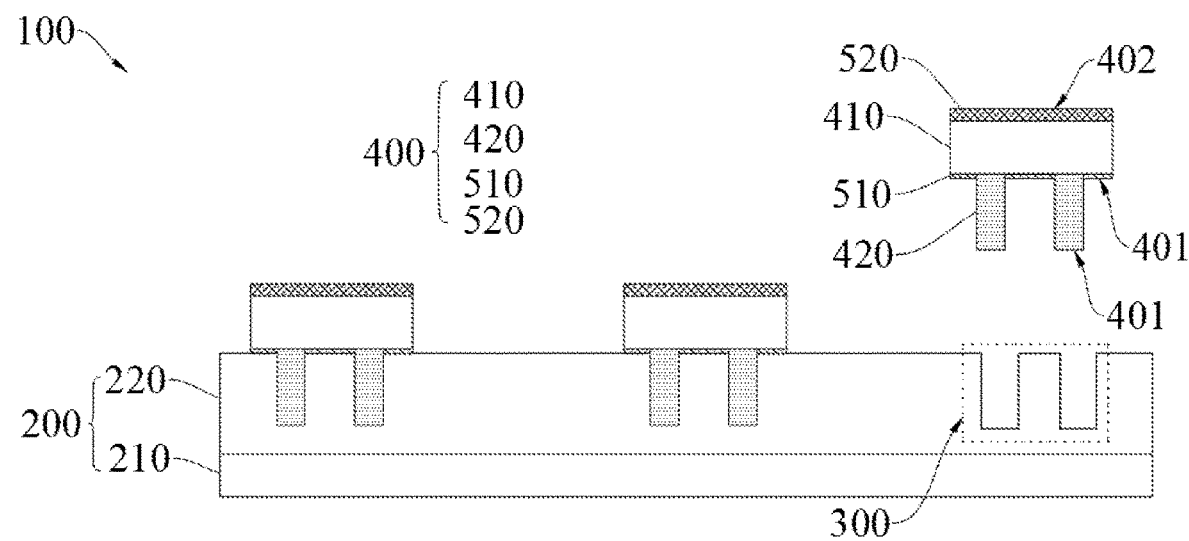
FIG. 4 is a schematic structural diagram of a fourth structure of the light-emitting substrate according to an embodiment of the present disclosure.

In some embodiments, referring to FIGS. 2 to 4, each of the light-emitting units 400 further includes a second functional layer 520 disposed on a same side as the second side 402, and the second side 402 includes a surface of the second functional layer 520 away from the first side 401. Wherein, an equilibrium contact angle of the first liquid on the surface of the second functional layer 520 is greater than 90°.

The second side 402 is facing away from the first liquid 600 and the first substrate 200. The evaporation rate of the first liquid 600 in the electrode opening-holes 300 is slow, thereby gradually leading the light-emitting units 400 into the electrode opening-holes 300 and realizing the alignment and fixation between the light-emitting units 400 and the first substrate 200. Therefore, the transferring method of the light-emitting chips 410 is optimized, and the transferring speed of the light-emitting chips 410 is accelerated, and the production efficiency is improved.

Figure 6:
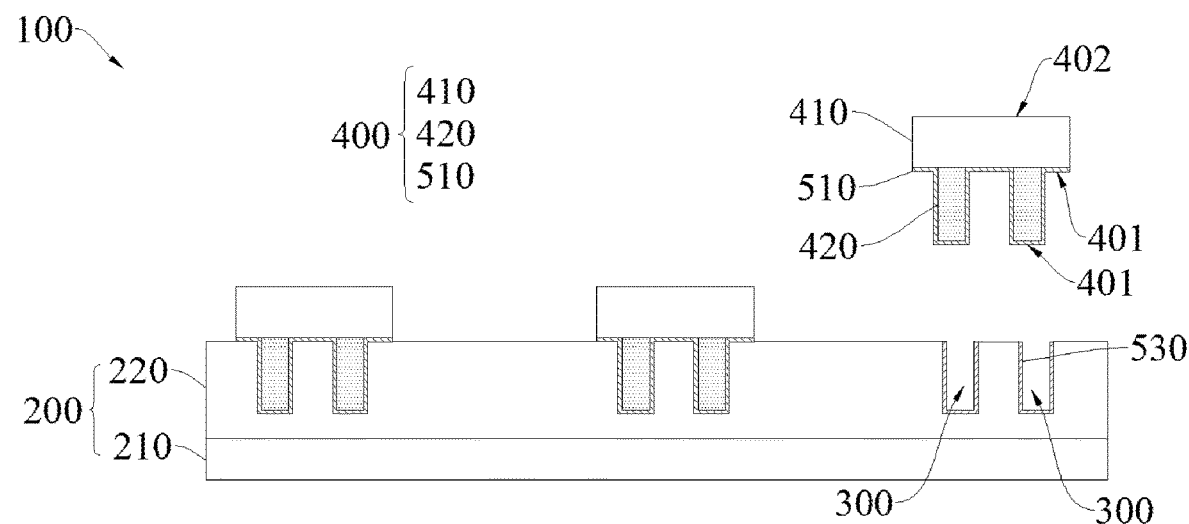
FIG. 6 is a schematic structural diagram of a sixth structure of the light-emitting substrate according to an embodiment of the present disclosure.

In some embodiments, referring to FIG. 6, the light-emitting substrate 100 further includes a third functional layer 530 disposed in at least one of the electrode opening-holes 300. Wherein, an equilibrium contact angle of the first liquid on a surface of the third functional layer 530 is less than 90°.

The third functional layer 530 includes a conductive material. When the first liquid 600 and the light-emitting units 400 are coated on the light-emitting substrate 100, the third functional layer 530 can improve the wettability of the first liquid in the electrode opening-holes 300, which is beneficial to lead electrode units 420 into the electrode opening-holes 300, thereby accelerating the transferring speed of the light-emitting chips 410 and improving the production efficiency.

In some embodiments, referring to FIG. 1, only the first functional layer 510 may be set; or referring to FIG. 2, only the second functional layer 520 may be set; or referring to FIG. 3, the first functional layer 510 and the second functional layer 520 may be set at the same time. All the three ways can make the electrode unit 420 toward the first liquid 600 and the first substrate 200. When the first liquid 600 is evaporated, the evaporation rate of the first liquid 600 in the electrode opening-holes 300 is slow, thereby gradually leading the light-emitting units 400 into the electrode opening-holes 300 and realizing the alignment and fixation between the light-emitting units 400 and the first substrate 200. Therefore, the transferring method of the light-emitting chips 410 is optimized, and the transferring speed of the light-emitting chips 410 is accelerated, and the production efficiency is improved.

In some embodiments, referring to FIGS. 8B and 8C, when manufacturing the light-emitting substrate 100, a wetting angle of the first liquid 600 on the first side 401 is set to be less than a wetting angle of the first liquid 600 on the second side 402, which allows the first side 401 toward the first liquid 600, thereby allowing the first side 401 toward the first substrate 200.

In some embodiments, referring to FIG. 1, each of the light-emitting units 400 further includes a light-emitting chip 410 electrically connected to the electrode unit 420.

In some embodiments, the light-emitting chip 410 may be a mini-LED or a micro-LED, which is not specifically limited herein.

In some embodiments, referring to FIG. 4, the first functional layer 510 covers a surface of the light-emitting chip 410 on the same side as the first side 401.

In some embodiments, referring to FIGS. 1 and 3, the first functional layer 510 covers the light-emitting chip 410 and the electrode unit 420. Wherein, the first functional layer 510 includes a wettable conductive material. When the first functional layer 510 covers the electrode unit 420, the first functional layer 510 needs to have conductivity in addition to wettability.

In some embodiments, the first functional layer 510 may include one or more of chromium, aluminum, zinc, chromium hydroxide, aluminum hydroxide, or zinc hydroxide. When the first functional layer 510 needs to be conductive, the first functional layer 510 may include one or more of chromium, aluminum, or zinc.

In some embodiments, the second functional layer 520 includes one or more of polytetrafluoroethylene, fluorinated polyethylene, fluorocarbon wax, asphalt, or paraffin.

In some embodiments, the first liquid 600 may be one of water, anhydrous ethanol, or benzene.

In some embodiments, referring to FIG. 1, the first substrate 200 includes a driving circuit layer 210 and a planarization layer 220 disposed on the driving circuit layer 210, and the planarization layer 220 includes the electrode opening-holes 300. The electrode unit 420 is electrically connected to the driving circuit layer 210 by the electrode opening-holes 300.

Figure 5:
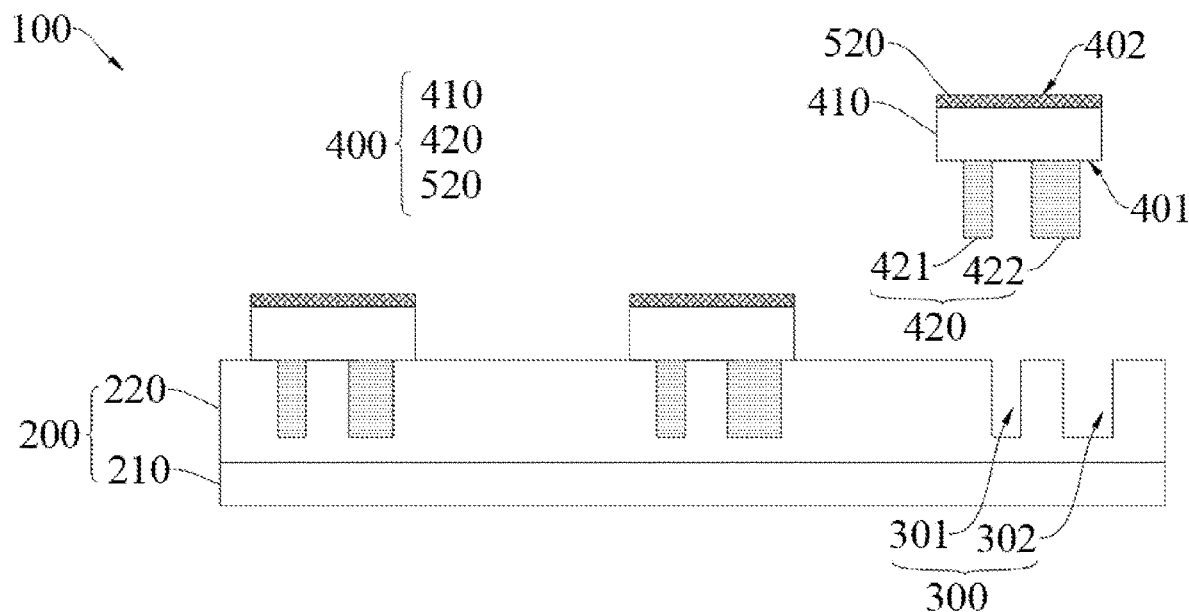
FIG. 5 is a schematic structural diagram of a fifth structure of the light-emitting substrate according to an embodiment of the present disclosure.

In some embodiments, referring to FIG. 5, one set of the electrode opening-holes 300 includes a positive electrode opening-hole 301 and a negative electrode opening-hole 302. One electrode unit 420 includes a positive electrode unit 421 and a negative electrode unit 422. A size of the positive electrode opening-hole 301 is different from a size of the negative electrode opening-hole 302, the positive electrode unit 421 corresponds to the positive electrode opening-hole 301, and the negative electrode opening-hole 302 corresponds to the negative electrode unit 422.

The size of the positive electrode opening-hole 301 is different from the size of the negative electrode opening-hole 302, which is a fool-proof design and can ensure electrode polarities of the electrode unit 420 to be aligned correctly, thereby improving the electrical stability.

Figure 9A:
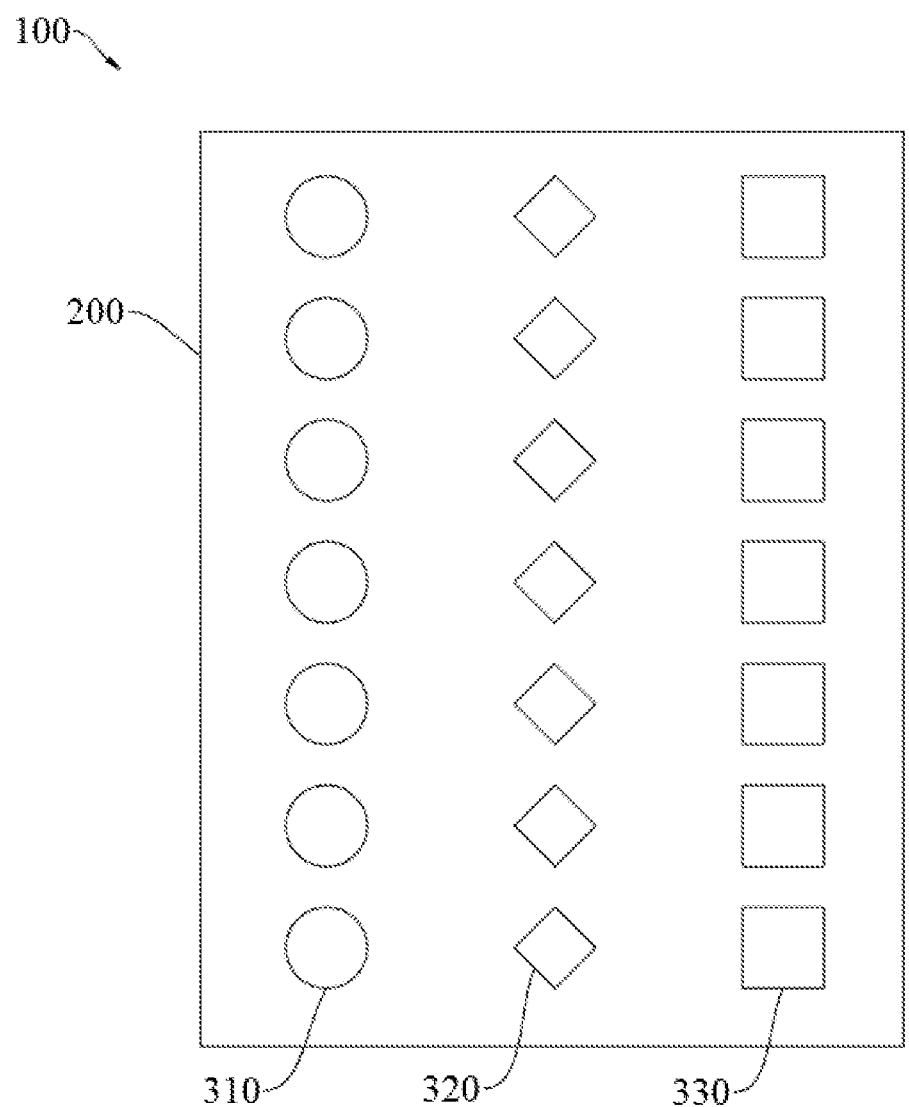
FIGS. 9A to 9B are second schematic process diagrams of the manufacturing method of the light-emitting substrate according to an embodiment of the present disclosure.

In some embodiments, referring to FIG. 9A, the light-emitting units 400 are one of first color units, second color units, or third color units, wherein, light-emitting colors of the first color units, the second color units, and the third color units are different from each other. The electrode opening-holes 300 are one of first opening-holes 310, second opening-holes 320, or third opening-holes 330. The first color units correspond to the first opening-holes 310, the second color units correspond to the second opening-holes 320, and the third color units correspond to the third opening-holes 330.

In some embodiments, the driving circuit layer 210 includes a substrate, an active layer disposed on the substrate, a first insulating layer disposed on the active layer, a gate electrode layer disposed on the first insulating layer, a second insulating layer disposed on the gate electrode layer, a source/drain electrode layer disposed on the second insulating layer, a third insulating layer disposed on the source/drain electrode layer, and an electrode layer disposed on the third insulating layer.

In some embodiments, the electrode opening-holes 300 expose the electrode layer. The electrode layer may include a plurality of traces and terminals, and the electrode opening-holes 300 expose the terminals.

In the present disclosure, the surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with the first liquid and coated on the first substrate. Taking advantage of the strong wettability of the first side, the electrode unit moves toward the first substrate. When the first liquid is evaporated, the evaporation rate of the first liquid in the electrode opening-holes is slow, thereby gradually leading the light-emitting units into the electrode opening-holes and realizing the alignment and fixation between the light-emitting units and the first substrate. Therefore, the transferring method of the light-emitting units is optimized, and the transferring speed of the light-emitting units is accelerated, and the production efficiency is improved.

Figure 7:
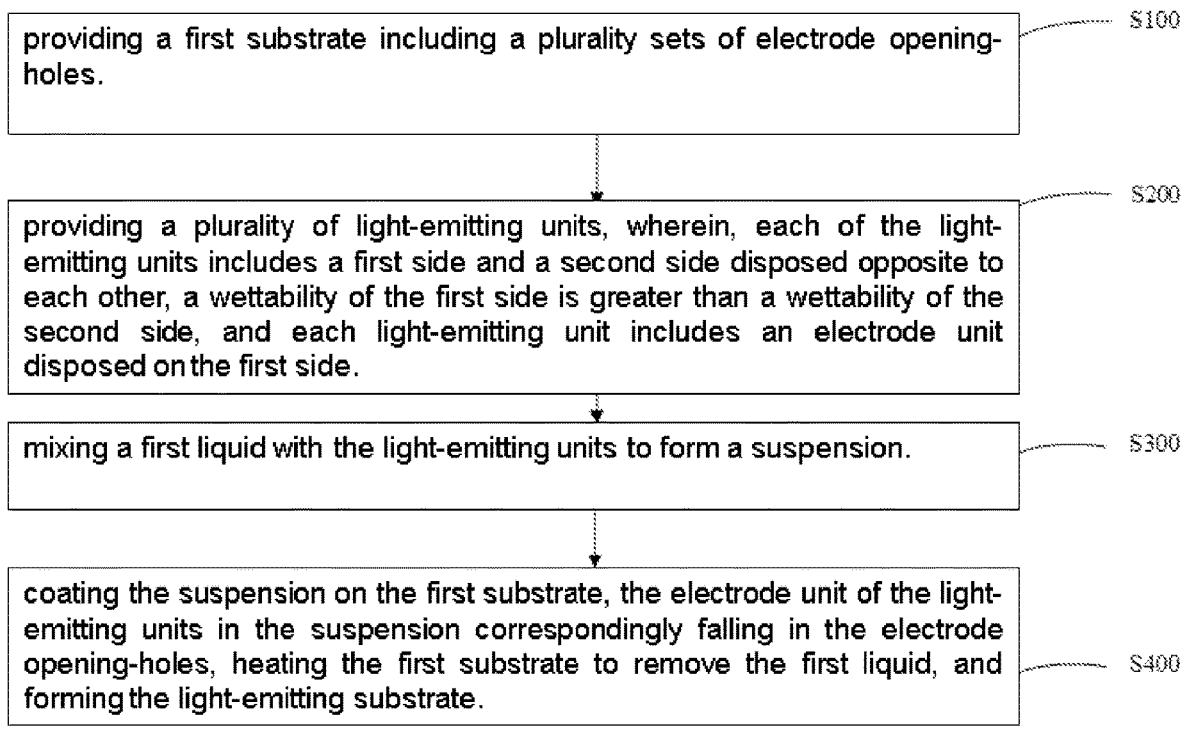
FIG. 7 is a flowchart of a manufacturing method of the light-emitting substrate according to an embodiment of the present disclosure.

Referring to FIG. 7, an embodiment of the present disclosure further provides a manufacturing method of the light-emitting substrate 100, which includes following steps:

S100: providing the first substrate 200 including the plurality sets of electrode opening-holes 300;

S200: providing the plurality of light-emitting units 400, wherein, each of the light-emitting units 400 includes the first side 401 and the second side 402 disposed opposite to each other, the wettability of the first side 401 is greater than the wettability of the second side 402, and each light-emitting unit 400 includes the electrode unit 420 disposed on the first side 401;

S300: mixing the first liquid 600 with the light-emitting units 400 to form a suspension; and S400: coating the suspension on the first substrate 200, the electrode unit 420 of the light-emitting units 400 in the suspension correspondingly falling in the electrode opening-holes 300, heating the first substrate 200 to remove the first liquid 600, and finally forming the light-emitting substrate 100.

In the present disclosure, the surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with the first liquid and coated on the first substrate. Taking advantage of the strong wettability of the first side, the electrode unit moves toward the first substrate. When the first liquid is evaporated, the evaporation rate of the first liquid in the electrode opening-holes is slow, thereby gradually leading the light-emitting units into the electrode opening-holes and realizing the alignment and fixation between the light-emitting units and the first substrate. Therefore, the transferring method of the light-emitting units is optimized, and the transferring speed of the light-emitting units is accelerated, and the production efficiency is improved.

Specific embodiments are used to describe technical solutions of the present disclosure.

In this embodiment, the manufacturing method of the light-emitting substrate 100 includes following steps:

S100: providing the first substrate 200 including the plurality sets of electrode opening-holes 300, referring to FIG. 8A.

In some embodiments, the step S100 includes a following step.

S110: providing the first substrate 200 including a plurality sets of first opening-holes 310, a plurality sets of second opening-holes 320, and a plurality sets of third opening-holes 330, referring to FIG. 9A.

Figure 9B:
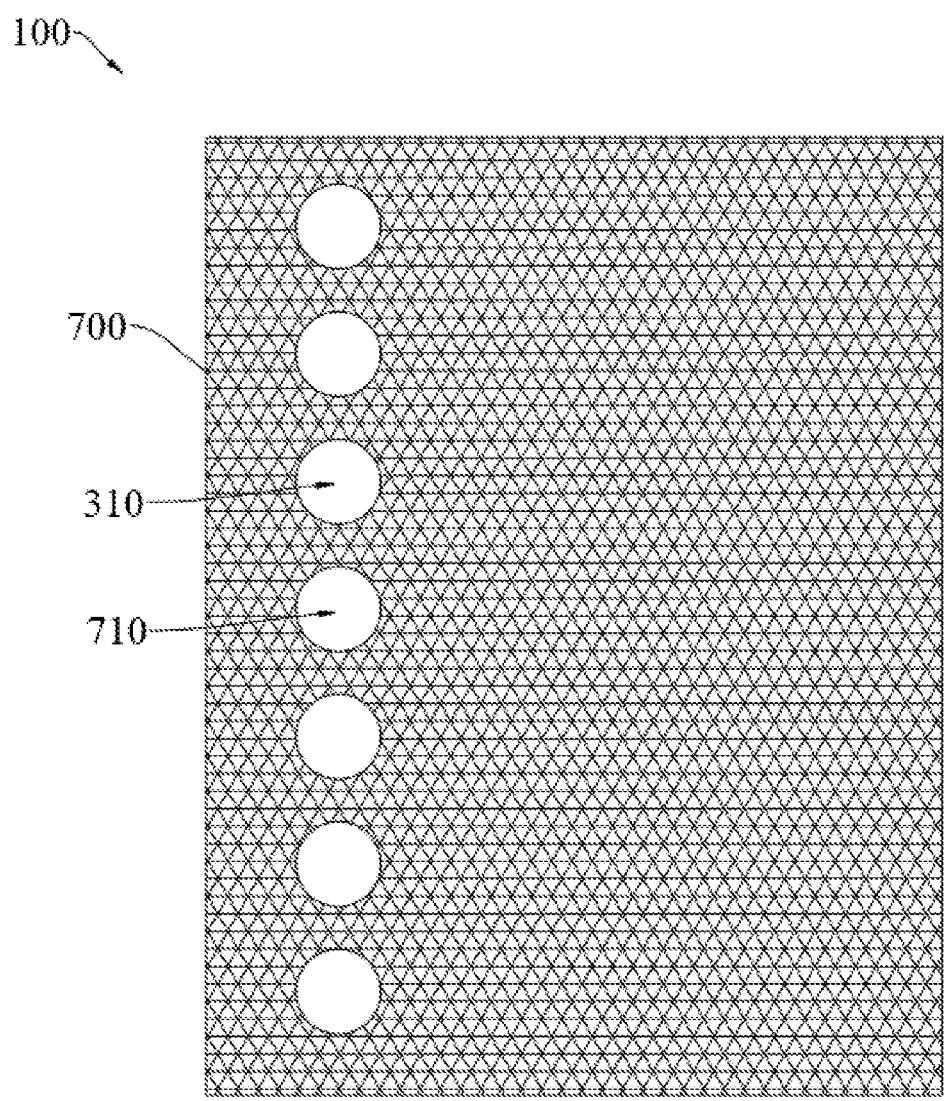
Figure 10:
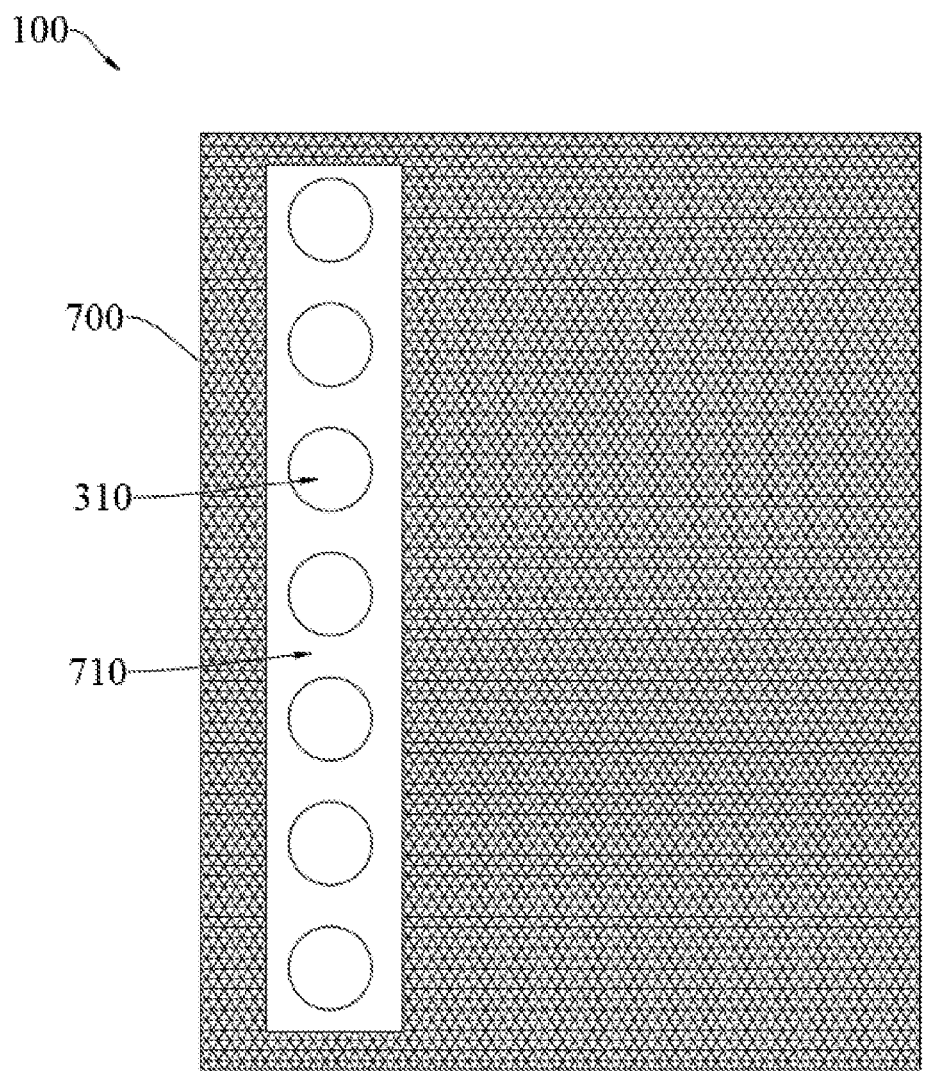
FIG. 10 is a third schematic process diagram of the manufacturing method of the light-emitting substrate according to an embodiment of the present disclosure.

In FIGS. 9A, 9B, and 10, it can be understood that shapes of the opening-holes are only to represent corresponding situations with electrodes of the light-emitting units having different colors, and are not the actual situation of the opening-holes.

In some embodiments, the first substrate 200 includes the driving circuit layer 210 and the planarization layer 220 disposed on the driving circuit layer 210, and the planarization layer 220 includes the electrode opening-holes 300. The electrode unit 420 is electrically connected to the driving circuit layer 210 by the electrode opening-holes 300.

In some embodiments, one set of the electrode opening-holes 300 includes a positive electrode opening-hole 301 and a negative electrode opening-hole 302. One electrode unit 420 includes a positive electrode unit 421 and a negative electrode unit 422. A size of the positive electrode opening-hole 301 is different from a size of the negative electrode opening-hole 302, the positive electrode unit 421 corresponds to the positive electrode opening-hole 301, and the negative electrode opening-hole 302 corresponds to the negative electrode unit 422.

S200: providing the plurality of light-emitting units 400, wherein, each of the light-emitting units 400 includes the first side 401 and the second side 402 disposed opposite to each other, the wettability of the first side 401 is greater than the wettability of the second side 402, and each light-emitting unit 400 includes the electrode unit 420 disposed on the first side 401, referring to FIG. 8B.

In some embodiments, the step S200 includes following steps.

S210: providing the plurality of light-emitting units 400, wherein, each light-emitting unit 400 includes the light-emitting chip 410 and the electrode unit 420, referring to FIG. 8B.

S220: forming the first functional layer 510 on a same side surface of the electrode unit 420 to form the first side 401 of the light-emitting units 400, wherein, the equilibrium contact angle of the first liquid 600 on the surface of the first functional layer 510 is less than 90°.

In some embodiments, the step S200 further includes following steps.

S230: forming the second functional layer 520 on an opposite side surface of the electrode unit 420 to form the second side 402 of the light-emitting units 400, wherein the equilibrium contact angle of the first liquid 600 on the surface of the second functional layer 520 is greater than 90°.

In some embodiments, the step S200 may include steps S210, S220, and S230, or may only include steps S210 and S220, or may only include steps S210 and S230.

In some embodiments, according to different light-emitting modes of the light-emitting substrate 100, the light-emitting units 400 may all be of a same color, or the light-emitting substrate 100 may also include light-emitting units 400 of three different colors.

In some embodiments, the light-emitting units 400 may all be of the same color, and the step S200 includes a following step:

S200a: providing the light-emitting units 400 of the same color, wherein, the light-emitting units 400 each includes the first side 401 and the second side 402 disposed opposite to each other, each light-emitting unit 400 includes the electrode unit 420 disposed on the same side as the first side 401, and the wettability of the first side 401 is greater than the wettability of the second side 402.

In some embodiments, the light-emitting color of the light-emitting units 400 may be blue.

In some embodiments, the light-emitting substrate 100 includes the light-emitting units 400 of three different colors, and the step S200 includes a following step:

S200A: providing the plurality of light-emitting units 400 including a plurality of first color units, a plurality of second color units, and a plurality of third color units, wherein, light-emitting colors of the first color units, the second color units, and the third color units are different from each other.

In some embodiments, the light-emitting colors of the first color units, the second color units, and the third color units may be red, green, and blue, respectively. This is only an example, and a specific sequence of formation is not limited herein.

S300: mixing the first liquid 600 with the light-emitting units 400 to form the suspension.

In some embodiments, the step S300 includes following steps:

S310: mixing the first liquid with the first color units to form a first suspension;

S320: mixing the first liquid with the second color units to form a second suspension; and S330: mixing the first liquid with the third color units to form a third suspension.

The light-emitting units 400 of the three colors are mixed with the first liquid to form the suspension, respectively, for subsequent coating.

S400: coating the suspension on the first substrate 200, and the electrode unit 420 of the light-emitting units 400 in the suspension correspondingly falling in the electrode opening-holes 300, referring to FIGS. 8C and 1.

In some embodiments, the light-emitting units 400 may all be of the same color, and the step S400 includes a following step:

S400a: coating the suspension on the first substrate 200, and the electrode unit 420 of the light-emitting units 400 in the suspension correspondingly falling in the electrode opening-holes 300, referring to FIGS. 8C and 1.

In some embodiments, the light-emitting substrate 100 includes the light-emitting units 400 of three different colors, and the step S400 includes a following step:

S400A: providing a first mask 700 including a plurality of first openings 710, wherein, the first openings 710 expose the first opening-holes 310, referring to FIG. 9B.

In the present disclosure, only the first opening-holes 310 are taken as an example for illustration, and applications and manufacturing methods of the second opening-holes 320 and the third opening-holes 330 are similar to those of the first opening-holes 310, which are not repeated herein.

In some embodiments, referring to FIG. 10, the first openings 710 may be rectangular openings, and one first opening 710 corresponds to a plurality of the first opening-holes 310. Shapes of the second openings and the third openings may be similar to that of the first openings 710, and are not repeated herein.

S400B: aligning the first mask 700 with the first substrate 200.

S400C: coating the first suspension on the first substrate 200, and the electrode unit 420 of the first color units in the first suspension correspondingly falling in the first opening-holes 310.

S400D: heating the first substrate 200 to remove the first liquid 600.

S400E: removing the first color units located outside the first opening-holes 310.

S400F: providing a second mask including a plurality of second openings, wherein, the second openings expose the second opening-holes 320.

S400G: aligning the second mask with the first substrate 200.

S400H: coating the second suspension on the first substrate 200, and the electrode unit 420 of the second color units in the second suspension correspondingly falling in the second opening-holes 320.

S400I: heating the first substrate 200 to remove the first liquid 600.

S400J: removing the second color units located outside the second opening-holes 320.

S400K: providing a third mask including a plurality of third openings, wherein, the third openings expose the third opening-holes 330.

S400L: aligning the third mask with the first substrate 200.

S400M: coating the third suspension on the first substrate 200, and the electrode unit 420 of the third color units in the third suspension correspondingly falling in the third opening-holes 330.

S400N: heating the first substrate 200 to remove the first liquid 600.

S400O: removing the third color units located outside the third opening-holes 330, and forming the light-emitting substrate 100.

In some embodiments, in the step of mixing the first liquid 600 with the light-emitting units 400, a quantity of the light-emitting units 400 is greater than a quantity of corresponding electrode opening-holes 300. Therefore, a hole-missing rate can be reduced.

In some embodiments, in the step of mixing the first liquid 600 with the light-emitting units 400 and coating them on the first substrate 200, the first liquid 600 submerged the light-emitting units 400, and a liquid level of the first liquid 600 is greater than a thickness of the light-emitting units 400.

In some embodiments, when the light-emitting units 400 do not fully fill corresponding electrode opening-holes 300, the step of mixing with the first liquid 600, coating, and heating may continue to be performed, thereby reducing the hole-missing rate; or using a pick-up method to pick up the light-emitting units 400 to the corresponding electrode opening-holes 300, thereby reducing the hole-missing rate.

In some embodiments, the first functional layer 510 may include one or more of chromium, aluminum, zinc, chromium hydroxide, aluminum hydroxide, or zinc hydroxide. When the first functional layer 510 needs to be conductive, the first functional layer 510 may include one or more of chromium, aluminum, or zinc.

In some embodiments, the second functional layer 520 includes one or more of polytetrafluoroethylene, fluorinated polyethylene, fluorocarbon wax, asphalt, or paraffin.

In some embodiments, the first liquid 600 may be one of water, anhydrous ethanol, or benzene.

In the present disclosure, the surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with the first liquid and coated on the first substrate. Taking advantage of the strong wettability of the first side, the electrode unit moves toward the first substrate. When the first liquid is evaporated, the evaporation rate of the first liquid in the electrode opening-holes is slow, thereby gradually leading the light-emitting units into the electrode opening-holes and realizing the alignment and fixation between the light-emitting units and the first substrate. Therefore, the transferring method of the light-emitting units is optimized, and the transferring speed of the light-emitting units is accelerated, and the production efficiency is improved.

Figure 11:
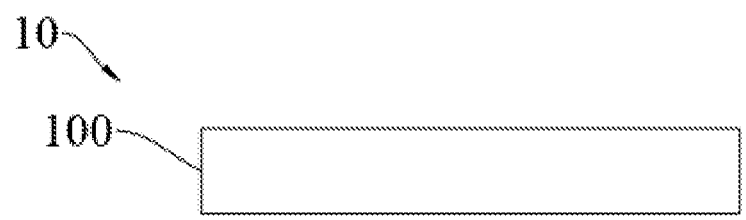
FIG. 11 is a schematic structural diagram of a display panel according to an embodiment of the present disclosure.

Referring to FIG. 11, an embodiment of the present disclosure further provides a display panel 10, which includes the light-emitting substrate 100 in any one of the above embodiments.

A specific structure of the light-emitting substrate 100 may refer to the light-emitting substrate 100 of the foregoing embodiments and drawings, which will not be repeated here.

In some embodiments, the display panel 10 may be a liquid crystal display panel 10 or a self-luminous display panel 10.

In some embodiments, the display panel 10 may be a liquid crystal display panel 10, which includes a liquid crystal layer, a color filter layer, and upper and lower polarizers. The light-emitting substrate 100 is a backlight unit corresponding to the display panel 10.

In some embodiments, the display panel 10 is a self-luminous display panel 10.

The embodiments of the present disclosure disclose the light-emitting substrate and the manufacturing method thereof. The light-emitting substrate includes the first substrate and the plurality of light-emitting units. The first substrate includes the plurality sets of electrode opening-holes. Each light-emitting unit includes the first side and the second side disposed opposite to each other. Each light-emitting unit includes the electrode unit disposed on a same side as the first side, the electrode unit is positioned in the electrode opening-holes, and the wettability of the first side is greater than the wettability of the second side. In the present disclosure, the surfaces of the light-emitting units are treated to allow the wettability of the first side of the light-emitting units that is on the same side as the electrode unit to be greater than the wettability of the second side that is opposite to the first side. When manufacturing the light-emitting substrate, the light-emitting units are mixed with the first liquid and coated on the first substrate. Taking advantage of the strong wettability of the first side, the electrode unit moves toward the first substrate. When the first liquid is evaporated, the evaporation rate of the first liquid in the electrode opening-holes is slow, thereby gradually leading the light-emitting units into the electrode opening-holes. Therefore, the alignment and fixation between the light-emitting units and the first substrate can be realized, and the transferring speed of the light-emitting units is accelerated.

The light-emitting substrate and the manufacturing method thereof provided in the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A light-emitting substrate, comprising:
   a first substrate comprising a plurality sets of electrode opening-holes; and
   a plurality of light-emitting units each comprising a first side and a second side disposed opposite to each other, wherein each light-emitting unit comprises an electrode unit disposed on the first side, and the electrode unit is positioned in the electrode opening-holes;
   wherein a wettability of the first side is greater than a wettability of the second side;
   wherein one set of the electrode opening-holes comprises a positive electrode opening-hole and a negative electrode opening-hole;
   the electrode unit comprises a positive electrode unit and a negative electrode unit; and
   a size of the positive electrode opening-hole is different from a size of the negative electrode opening-hole, the positive electrode unit corresponds to the positive electrode opening-hole, and the negative electrode opening-hole corresponds to the negative electrode unit.

2. The light-emitting substrate according to claim 1, wherein each of the light-emitting units further comprises a first functional layer disposed on the first side, and the first side comprises a surface of the first functional layer away from the second side; and
   an equilibrium contact angle of a first liquid on the surface of the first functional layer is less than 90°.

3. The light-emitting substrate according to claim 2, wherein each of the light-emitting units further comprises a second functional layer disposed on the second side, and the second side comprises a surface of the second functional layer away from the first side; and
   an equilibrium contact angle of the first liquid on the surface of the second functional layer is greater than 90°.

4. The light-emitting substrate according to claim 3, wherein the first liquid comprises one of water, anhydrous ethanol, or benzene.

5. The light-emitting substrate according to claim 2, wherein each of the light-emitting units further comprises a light-emitting chip electrically connected to the electrode unit;
   the first functional layer covers the light-emitting chip and the electrode unit; and
   the first functional layer comprises a conductive material.

6. The light-emitting substrate according to claim 1, wherein the first substrate comprises a driving circuit layer and a planarization layer disposed on the driving circuit layer, and the planarization layer comprises the electrode opening-holes; and
   the electrode unit is electrically connected to the driving circuit layer by the electrode opening-holes.

7. The light-emitting substrate according to claim 1, further comprising a third functional layer disposed in at least one of the electrode opening-holes, wherein an equilibrium contact angle of a first liquid on a surface of the third functional layer is less than 90°.

8. A manufacturing method of a light-emitting substrate, comprising following steps:
   providing a first substrate comprising a plurality sets of electrode opening-holes, wherein one set of the electrode opening-holes comprises a positive electrode opening-hole and a negative electrode opening-hole, and a size of the positive electrode opening-hole is different from a size of the negative electrode opening-hole;
   providing a plurality of light-emitting units, wherein each of the light-emitting units comprises a first side and a second side disposed opposite to each other, a wettability of the first side is greater than a wettability of the second side, and each light-emitting unit comprises an electrode unit disposed on the first side, wherein the electrode unit comprises a positive electrode unit and a negative electrode unit;
   mixing a first liquid with the light-emitting units to form a suspension; and
   coating the suspension on the first substrate, the electrode unit of the light-emitting units in the suspension correspondingly falling in the electrode opening-holes, heating the first substrate to remove the first liquid, and forming the light-emitting substrate, wherein the positive electrode unit corresponds to the positive electrode opening-hole, and the negative electrode opening-hole corresponds to the negative electrode unit.

9. The manufacturing method of the light-emitting substrate according to claim 8, wherein the step of providing the plurality of light-emitting units, wherein each of the light-emitting units comprises the first side and the second side disposed opposite to each other, the wettability of the first side is greater than the wettability of the second side, and each light-emitting unit comprises the electrode unit disposed on the first side, comprises following steps:
   providing the plurality of light-emitting units, wherein each light-emitting unit comprises a light-emitting chip and the electrode unit; and
   forming a first functional layer on a surface of the electrode unit to form the first side of the light-emitting units, wherein an equilibrium contact angle of the first liquid on a surface of the first functional layer is less than 90°.

10. The manufacturing method of the light-emitting substrate according to claim 9, wherein the step of providing the plurality of light-emitting units, wherein each of the light-emitting units comprises the first side and the second side disposed opposite to each other, the wettability of the first side is greater than the wettability of the second side, and each light-emitting unit comprises the electrode unit disposed on the first side, comprises following steps:
   providing the plurality of light-emitting units, wherein each light-emitting unit comprises the light-emitting chip and the electrode unit; and
   forming a second functional layer on an opposite side surface of the electrode unit to form the second side of the light-emitting units, wherein an equilibrium contact angle of the first liquid on a surface of the second functional layer is greater than 90°.

11. The manufacturing method of the light-emitting substrate according to claim 8, wherein the step of providing the first substrate comprising the plurality sets of electrode opening-holes comprises a following step:
   providing the first substrate comprising a plurality sets of first opening-holes, a plurality sets of second opening-holes, and a plurality sets of third opening-holes;

the step of providing the plurality of light-emitting units comprises a following step:

providing the plurality of light-emitting units comprising a plurality of first color units, a plurality of second color units, and a plurality of third color units, wherein light-emitting colors of the first color units, the second color units, and the third color units are different from each other;

the step of mixing the first liquid with the light-emitting units to form the suspension comprises following steps:

mixing the first liquid with the first color units to form a first suspension;

mixing the first liquid with the second color units to form a second suspension; and mixing the first liquid with the third color units to form a third suspension;

the step of coating the suspension on the first substrate and the electrode unit of the light-emitting units in the suspension correspondingly falling in the electrode opening-holes, comprises following steps:

providing a first mask comprising a plurality of first openings, wherein the first openings expose the first opening-holes;

aligning the first mask with the first substrate;

coating the first suspension on the first substrate, and the electrode unit of the first color units in the first suspension correspondingly falling in the first opening-holes;

heating the first substrate to remove the first liquid;

removing the first color units located outside the first opening-holes;

providing a second mask comprising a plurality of second openings, wherein the second openings expose the second opening-holes;

aligning the second mask with the first substrate;

coating the second suspension on the first substrate, and the electrode unit of the second color units in the second suspension correspondingly falling in the second opening-holes;

heating the first substrate to remove the first liquid;

removing the second color units located outside the second opening-holes;

providing a third mask comprising a plurality of third openings, wherein the third openings expose the third opening-holes;

aligning the third mask with the first substrate;

coating the third suspension on the first substrate, and the electrode unit of the third color units in the third suspension correspondingly falling in the third opening-holes;

heating the first substrate to remove the first liquid; and removing the third color units located outside the third opening-holes, and forming the light-emitting substrate.

* * * * *